(12) United States Patent
Wallace, Jr. et al.

(10) Patent No.: US 6,396,301 B1
(45) Date of Patent: May 28, 2002

(54) GROUND BOUNCE PREDICTION METHODOLOGY AND USE OF SAME IN DATA ERROR REDUCTION

(75) Inventors: Douglas Elmer Wallace, Jr.; James Bryce Mobley, both of Austin, TX (US)

(73) Assignee: Dell Products L.P., Round Rock, TX (US)

(*) Notice: Subject to any disclaimer, the term of this patent is extended or adjusted under 35 U.S.C. 154(b) by 0 days.

(21) Appl. No.: 09/766,203

(22) Filed: Jan. 19, 2001

(51) Int. Cl.[7] ............................................. H03K 17/16
(52) U.S. Cl. ............................ 326/31; 326/27; 327/74
(58) Field of Search ............................. 326/26, 27, 31, 326/34; 327/74, 76, 63, 71; 340/146.2

(56) References Cited

U.S. PATENT DOCUMENTS 5,854,560 A * 12/1998 Chow ........................... 326/27
6,087,847 A * 7/2000 Mooney et al. ................. 326/30
6,184,729 B1 * 2/2001 Pasqualini ..................... 327/112

FOREIGN PATENT DOCUMENTS

JP            2000174606 A   *  6/2000

* cited by examiner

Primary Examiner—Michael Tokar
Assistant Examiner—James H Cho
(74) Attorney, Agent, or Firm—Haynes and Boone, LLP

(57) ABSTRACT

A methodology for predicting incidents of ground bounce and using this information for reducing data error caused thereby is described. In one embodiment, data to be clocked into a plurality of output buffers from a first register is read before it goes to the buffers and a determination is made as to what number of bits B will change state, i.e., from a zero to a one or a one to a zero. B is then compared to a predetermined threshold T. If B is greater than T, a wait state or some other indication is issued when the bits are clocked into the I/O buffers.

17 Claims, 2 Drawing Sheets

US 6,396,301 B1

GROUND BOUNCE PREDICTION METHODOLOGY AND USE OF SAME IN DATA ERROR REDUCTION

BACKGROUND

The disclosures herein relate generally to ground bounce caused by simultaneous switching of I/O buffers in complex integrated circuits and, more particularly, to a ground bounce prediction methodology and use thereof in data error reduction.

Simultaneous switching of I/O buffers in complex integrated circuits create sudden shifts in the ground and power plane voltages. These shifts, generically referred to as "ground bounce," cause relative shifts in the output buffers' signals to the extent that a "0" can be detected as a "1" and vice versa, causing data errors. This problem is becoming increasingly troublesome due to lowered signal voltage levels and their consequent lower noise margins and the increase in density of I/O in increasingly complex chips. The worst ground bounce scenarios occur when most or all I/O buffers drive their output simultaneously.

Prior methods of addressing the above-described problem include adjusting the slew rate of individual I/O buffers, increasing the interplane capacitance using on-chip capacitors, and increasing the decoupling in the immediate region of the transmitting chip. These prior art solutions suggest the use of long phase delay periods on the order of the ground bounce resonance period, but do not include phase de-skewing and are therefore not exceedingly practical without a major revision of bus timing and protocol. They also fail to provide a methodology for predicting ground bounce and for using this prediction information in reducing data error.

Therefore, what is needed is a ground bounce prediction methodology and use thereof in data error reduction.

SUMMARY

One embodiment, accordingly, is a methodology for predicting incidents of ground bounce and using this information for reducing data error caused thereby. In particular, data to be clocked into a plurality of output buffers from a first register is read before it goes to the buffers and a determination is made as to what number of bits B will change state, i.e., from a zero to a one or a one to a zero. B is then compared to a predetermined threshold T. If B is greater than T, a wait state or some other indication will be issued when the bits are clocked into the I/O buffers.

A principal advantage of the embodiment is that ground bounce can be predicted prior to its occurrence and steps taken to reduce data error caused thereby.

DETAILED DESCRIPTION

Figure 1:
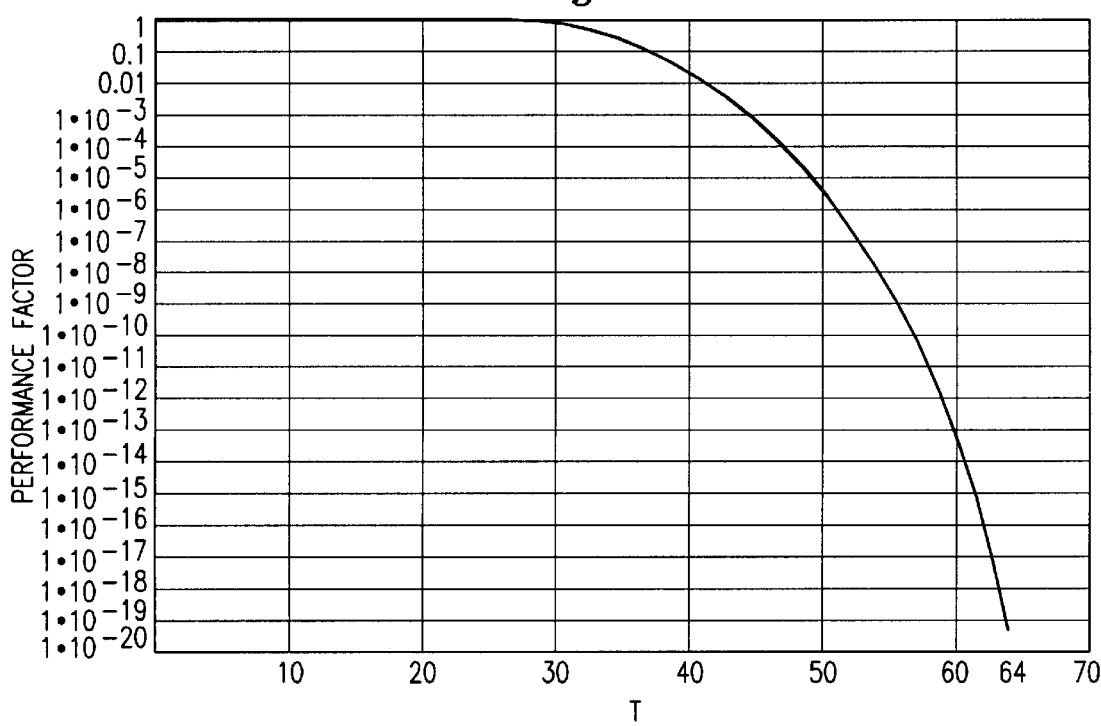
FIG. 1 is a graph illustrating the performance of one embodiment versus the predetermined threshold T.

As previously described, simultaneous switching of I/O buffers causes ground bounce. If all N bits of an output register switch simultaneously and/or in the same direction, the amplitude of the ground bounce will be at a maximum. If some number of bits, B, less than N, change, the amplitude of the ground bounce will be reduced to a fraction (approximately B/N) of the maximum value.

If the output data to the buffers can be read before it goes to the output buffers, as is usually the case in pipelined architectures, the amount of ground bounce that will occur can be predicted. This can be accomplished by performing a is bit-by-bit subtraction between two pipelined registers to determine the number of bits that will change. For example, assuming two N-bit pipelined registers A0 and A1 are destined to be output in the order of register A0 first and register A1 second, a bit-by-bit subtraction using an exclusive-OR gate will yield a register D with N bits therein. A simple determination of the number of ones in register D gives the number of bits that will change when the data in register A1 is output. The following example illustrates the foregoing with 16-bit registers.

| A1 | 1001110010010010 | |
| A0 | 1010010011010010 | |
| D | 0011100001000000 | (A1 − A0) showing that 4 bits will change |

At this point, a threshold T for the value of B must be selected. As will be described in greater detail below with reference to FIG. 2, the selected threshold T can be programmed into the circuitry. During operation, if B is greater than the threshold T, indicating that a ground bounce will occur, a signal is issued to additional on-chip logic generally before the contents of register A1 is clocked into the output buffers. Any number of actions can be taken once the on-chip logic is notified of a possibly ground bounce corrupted write cycle. For example, in a common SDRAM memory subsystem, a CKE signal could be deasserted to cause a "wait-state" while the possibly corrupted data is allowed to settle an additional clock cycle.

As illustrated below, the performance impact of the foregoing is minimal, given an appropriate selection for the threshold T. For example, given a register size of N, it will be recognized that there is an effect on the transfer data rate caused by inserting a wait state every time more than T bits are changing. Clearly, if T is set to 0, thus forcing a wait state for every transaction, the transfer data rate will be cut in half, assuming that each data transfer takes one cycle and a wait state is one cycle long. If T is set to 75% of N, or some other non-zero number, the effect on the transfer data rate can be estimated as follows.

Assume that the output data is essentially random over long periods of time (e.g., minutes), which is reasonable for benchmarking times. For a register of length N, there is a population, P, of possible configurations.

$$P = 2^N \tag{1}$$

In an N-bit register, with some number B bits set to 1, where 1 represents a changing bit, and the remaining bits set to 0, there are C possible configurations, where:

$$C = \frac{N!}{(N-B)! \cdot B!} \tag{2}$$

The probability, p, that a combination of four 1s and 12 0s in a register will be seen in a random sample of 16-bit registers will be:

$$p = \frac{C}{P} \quad \text{or} \quad p = \frac{N!}{(N-B)! \cdot B! \cdot 2^N} \quad (3)$$

In the case of four bits in a 16-bit register, the probability would be 1820/65,536, or about 2.8%. If we set the threshold T to four bits, we are really looking for the cases in which 4 or more bits are changing. The number of combinations increases, and is just C(4)+C(5)+. . . C(16). Therefore, p1(B), the probability of seeing a combination of B bits or more in an N bit word, is:

$$p1(B) = \left( \sum_{x=B}^{N} \frac{N!}{(N-x)! \cdot x!} \right) \cdot \frac{1}{2^N} \quad (4)$$

In our example, p1(4) would be about 0.989, an almost certainty. Selecting the threshold, T, to be four would not be advisable, but selecting it to be 12 would create a performance hit of only 3.8% for a ground bounce reduction of about 25%.

FIG. 1 illustrates a plot of the performance vs. the threshold T using equation (4) above, where the performance factor is just the probability, p1. A performance factor of 1 would mean that a wait-state is performed on every transaction. Notice that the performance hit drops to 1% at about 42 bits, and then declines dramatically for T values above 42. A 15% safety boundary would require a T value of 54 bits; the performance hit is only 9.98×10^-9, or a wait state approximately every 100 million words. At a data rate of 133 MHz, a wait state would occur approximately (on average) every 750 milliseconds.

Figure 2:
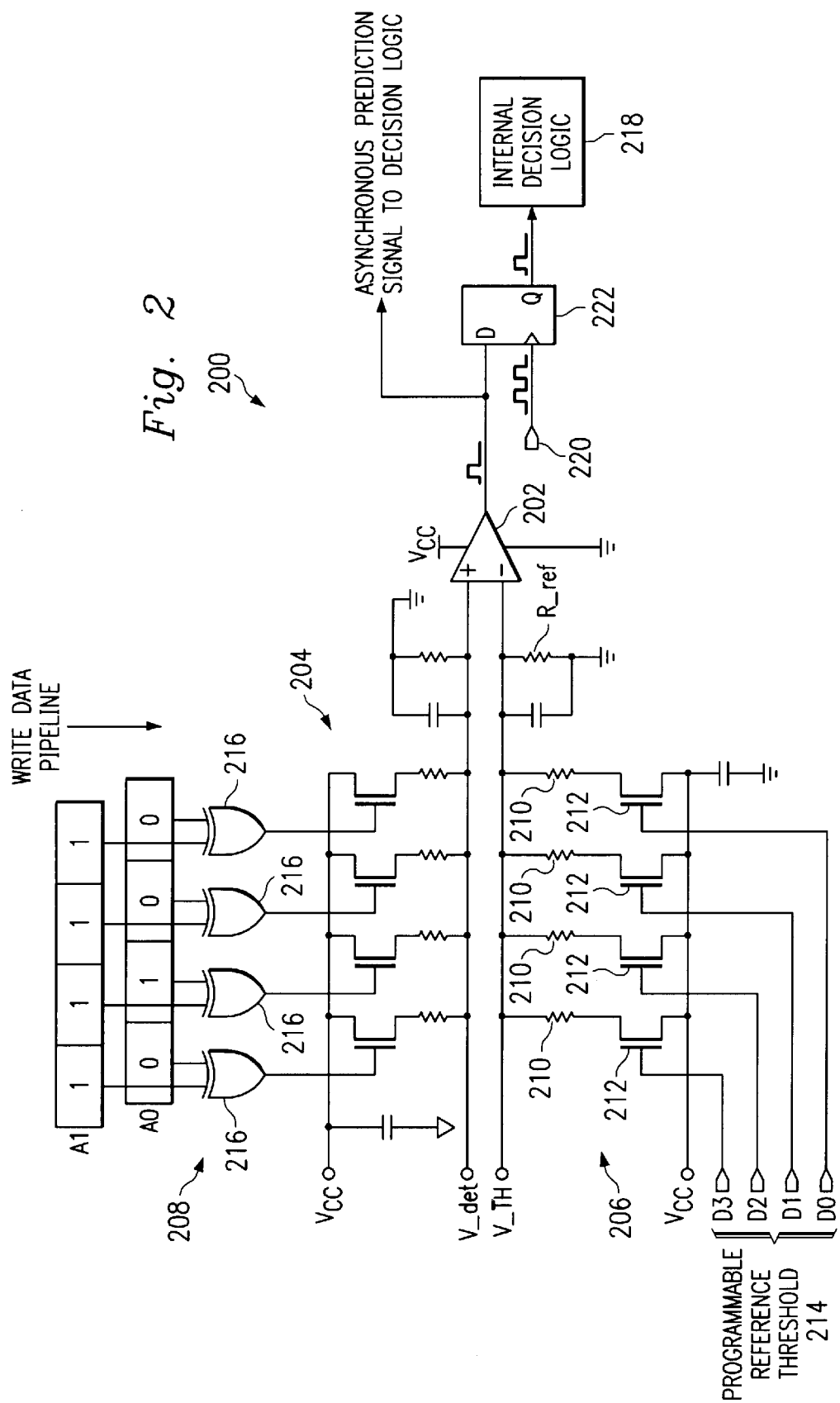
FIG. 2 is a schematic diagram of a ground bounce prediction circuit embodying features of one embodiment.

FIG. 2 is a schematic diagram of one embodiment of an on-chip ground bounce prediction circuit 200. The ground bounce prediction circuit 200 consists essentially of a comparator 202 that compares a detection voltage V_det derived from comparing two stages, represented in FIG. 2 by two four-bit registers A0, A1, of a data write pipeline with a programmable threshold voltage V_th. The embodiment illustrated in FIG. 2 uses only four bits, but the concept is extensible to as many bits as necessary. Generally, a fast adder 204 will equal the number of data bus bits (in this case, four) and the programmable reference threshold V_th can use fewer bits for whatever level of granularity is deemed necessary.

The circuit 200 is essentially two voltage divider networks 206, 208, respectively connected to the inputs of a comparator 202. The programmable voltage threshold V_th is derived from the divider network 206, which is connected to the inverting input of the comparator 202. Half of the divider network 206 consists of a fixed resistor value R_ref tied to ground. The other half of the divider network 206 is a group of n resistors 210 connected in parallel. Each of the resistors 210 can be individually switched in or out of the network 206 via a respective switch 212 and is tied to Vcc. The threshold voltage V_th is programmable by writing a binary value corresponding to the desired voltage threshold into a control register 214 that controls the state of the switches 212 and is determined by the overall resistance of the selected resistors 210 in series with the fixed resistor R_ref. The divider network 208 including the fast adder 204 is tied to the non-inverting input of the comparator 202 and works similarly, with the difference being that switch control is achieved through an XOR subtractive comparison of each bit location in the pipelined data registers A0, A1, using a number of XOR gates 216 instead of a programmable bit pattern. The output of the comparator 202 signals additional on-chip logic 218 as to the number of bits that will be switching and can be synchronized to an internal write clock 220 by means of a simple latch 222, if desired.

As can be seen, the principal advantage of the embodiments is that they enable the prediction of ground bounce events and the use of such information in various manners to reduce data error caused by such ground bounce events.

Although illustrative embodiments have been shown and described, a wide range of modification, change and substitution is contemplated in the foregoing disclosure and in some instances, some features of the embodiment may be employed without a corresponding use of other features. Accordingly, it is appropriate that the appended claims be construed broadly and in a manner consistent with the scope of the embodiments disclosed herein.

What is claimed is:

1. A method of predicting and reducing ground bounce events in an integrated circuit ("IC") comprising a plurality of buffers, the method comprising:
    prior to clocking data into the buffers from a first register, reading the data;
    determining a number of the buffers that will change state when the data is clocked into the buffers;
    comparing the number of the buffers that will change state with a predetermined threshold; and
    if the number of the buffers that will change state is greater than or equal to the predetermined threshold, issuing an indication signal.

2. The method of claim 1 wherein the issuing an indication signal comprises inserting a wait state before the data is clocked into the buffers.

3. The method of claim 1 wherein the issuing an indication signal comprises notifying a logic circuit that the number of buffers that will change state is greater than or equal to the predetermined threshold, wherein the logic circuit initiates an action to reduce ground bounce resulting therefrom.

4. The method of claim 1 further comprising selecting the predetermined threshold.

5. The method of claim 4 wherein N represents a size of the first register in number of bits, T represents the predetermined threshold, B represents a minimum number of the buffers that will change state when the data is clocked into the buffers, and p1(B) represents a probability of B or more buffers changing state in an N bit word and is equal to:

$$p1(B) = \left( \sum_{x=B}^{N} \frac{N!}{(N-x)! \cdot x!} \right) \cdot \frac{1}{2^N}$$

and wherein the selecting comprises:
    selecting a value for B that is at least 75% of N and that causes p1(B) to be less than 5%; and
    setting T equal to the selected value for B.

6. Apparatus for predicting and reducing ground bounce events in an integrated circuit ("IC") comprising a plurality of buffers, the apparatus comprising:
    means for reading data stored in a first register prior to clocking the data from the first register into the buffers;
    means for determining a number of the buffers that will change state when the data is clocked into the buffers;
    means for comparing the number of the buffers that will change state with a predetermined threshold; and
    means for issuing an indication signal if the number of the buffers that will change state is greater than or equal to the predetermined threshold.

7. The apparatus of claim 6 wherein the means for issuing an indication signal comprises means for inserting a wait state before the data is clocked into the buffers.

8. The apparatus of claim 6 wherein the means for issuing an indication signal comprises means for notifying a logic circuit that the number of buffers that will change state is greater than or equal to the predetermined threshold, wherein the logic circuit initiates an action to reduce ground bounce resulting therefrom.

9. The apparatus of claim 8 wherein the means for notifying comprises a comparator for comparing the number of buffers that will change state with the predetermined threshold.

10. The apparatus of claim 6 wherein the means for determining comprises a fast adder for comparing the data stored in the first register with data stored in a second register, wherein the data stored in the second register represents data to be clocked out of the buffers when the data from the first register is clocked into the buffers.

11. The apparatus of claim 6 wherein N represents a size of the first register in number of bits, T represents the predetermined threshold, B represents a minimum number of the buffers that will change state when the data is clocked into the buffers, and p1 (B) represents a probability of B or more buffers changing state in an N bit word and is equal to:

$$p1(B) = \left( \sum_{x=B}^{N} \frac{N!}{(N-x)! \cdot x!} \right) \cdot \frac{1}{2^N}$$

and wherein the predetermined threshold is selected by:
   selecting a value for B that is at least 75% of N and that causes p1(B) to be less than 5%; and
   setting T equal to the selected value for B.

12. Apparatus for predicting and reducing ground bounce events in an integrated circuit ("IC") comprising a plurality of buffers, the apparatus comprising:
   first and second registers for storing data to be clocked into the buffers sequentially, wherein, during normal operation, data is clocked from the first register into the second register and from the second register into the buffers each clock cycle;
   a first comparison circuit for comparing data stored in the first and second registers to determine the number of buffers that will change state when the data from the first register is ultimately clocked into the buffers;
   a second comparison circuit for comparing the number determined by the comparison circuit with a predetermined threshold for issuing an indication signal if the number of the buffers that will change state is greater or equal to than the predetermined threshold; and
   a logic circuit for receiving the indication signal and initiating an action for reducing ground bounce caused by the number of output buffers changing state being greater than or equal to the predetermined threshold.

13. The apparatus of claim 12 wherein the action initiated by the logic circuit inserting a wait state before the data from the first register is ultimately clocked into the buffers.

14. The apparatus of claim 12 wherein the first comparison circuit comprises an adder circuit that performs a bit-by-bit comparison of data stored in the first and second registers and outputs a number indicating the number of bits that differ.

15. The apparatus of claim 14 wherein the second comparison circuit comprises a comparator for comparing the number output from the adder circuit with the predetermined threshold and outputting an indication signal when the number output from the adder circuit is greater than or equal to the predetermined threshold.

16. The apparatus of claim 12 wherein the second comparison circuit comprises a two input comparator.

17. The apparatus of claim 12 wherein N represents a size of the first register in number of bits, T represents the predetermined threshold, B represents a minimum number of the buffers that will change state when the data from the first register is clocked into the buffers, and p1(B) represents a probability of B or more buffers changing state in an N bit word and is equal to:

$$p1(B) = \left( \sum_{x=B}^{N} \frac{N!}{(N-x)! \cdot x!} \right) \cdot \frac{1}{2^N}$$

and wherein the predetermined threshold is selected by:
   selecting a value for B that is at least 75% of N and that causes p1(B) to be less than 5%; and
   setting T equal to the selected value for B.

* * * * *